(12) United States Patent  (10) Patent No.: US 7,981,472 B2
Dalton et al.  (45) Date of Patent: Jul. 19, 2011

(54) METHODS OF PROVIDING UNIFORM GAS DELIVERY TO A REACTOR

(75) Inventors: Jeremie J. Dalton, San Jose, CA (US); M. Ziaul Karim, San Jose, CA (US); Ana R. Londergan, Santa Clara, CA (US)

(73) Assignee: Aixtron, Inc., Sunnyvale, CA (US)

( * ) Notice: Subject to any disclaimer, the term of this patent is extended or adjusted under 35 U.S.C. 154(b) by 0 days.

(21) Appl. No.: 12/553,917

(22) Filed: Sep. 3, 2009

(65) Prior Publication Data
US 2009/0324829 A1  Dec. 31, 2009

Related U.S. Application Data

(62) Division of application No. 11/278,700, filed on Apr. 5, 2006, now abandoned.

(51) Int. Cl.
C23C 16/455 (2006.01)
(52) U.S. Cl. ............ 427/255.23; 427/255.28; 117/84; 117/88
(58) Field of Classification Search ............ 427/255.23, 427/255.28; 117/88, 91, 84
See application file for complete search history.

(56) References Cited

U.S. PATENT DOCUMENTS

| | | |
|---|---|---|
| 4,829,021 A | 5/1989 | Fraas et al. |
| 5,387,289 A | 2/1995 | Schmitz et al. |
| 5,441,703 A | 8/1995 | Jurgensen |
| 5,871,586 A | 2/1999 | Crawley et al. |
| 6,196,251 B1 | 3/2001 | Roehle |
| 6,206,972 B1 | 3/2001 | Dunham |
| 6,284,673 B2 | 9/2001 | Dunham |
| 6,309,465 B1 | 10/2001 | Jurgensen et al. |
| 6,478,872 B1 | 11/2002 | Chae et al. |
| 6,540,838 B2 | 4/2003 | Sneh et al. |
| 6,616,766 B2 | 9/2003 | Dunham |
| 6,786,973 B2 | 9/2004 | Strauch et al. |
| 6,849,241 B2 | 2/2005 | Dauelsberg et al. |
| 7,018,940 B2 | 3/2006 | Dunham |
| 7,264,846 B2 * | 9/2007 | Chang et al. ............... 427/248.1 |

(Continued)

FOREIGN PATENT DOCUMENTS
DE 4326697 3/1995
(Continued)

OTHER PUBLICATIONS

Genus, Inc., EP Application No. 07251447.4 filed Mar. 30, 2007, European Search Report and Written Opinion, May 16, 2008, 7pp.

*Primary Examiner* — Bret Chen
(74) *Attorney, Agent, or Firm* — SNR Denton US LLP

(57) ABSTRACT

A method of introducing gasses through a gas distribution system into a reactor involves flowing the gasses through at least two distinct gas source orifice arrays displaced from one another along an axis defined by a gas flow direction from the gas source orifice arrays towards a work-piece. During different time intervals, a purge gas and different reactive precursors are flowed into the reactor from different ones of the gas source orifice arrays. One of the precursors may be associated with a soft saturating atomic layer deposition half reaction and another of the precursors associated with a strongly saturating atomic layer deposition half reaction. An upper one of the gas source orifice arrays may be a relatively planar gas orifice array.

15 Claims, 3 Drawing Sheets

U.S. PATENT DOCUMENTS

| | | | |
|---|---|---|---|
| 2001/0007244 A1* | 7/2001 | Matsuse | 118/719 |
| 2001/0034123 A1* | 10/2001 | Jeon et al. | 438/643 |
| 2003/0121608 A1* | 7/2003 | Chen et al. | 156/345.33 |
| 2003/0129308 A1* | 7/2003 | Chen et al. | 427/255.28 |
| 2003/0143841 A1* | 7/2003 | Yang et al. | 438/656 |
| 2003/0177977 A1 | 9/2003 | Strauch et al. | |
| 2003/0190423 A1* | 10/2003 | Yang et al. | 427/255.28 |
| 2003/0200929 A1 | 10/2003 | Otsuki | |
| 2004/0035358 A1* | 2/2004 | Basceri et al. | 118/715 |
| 2004/0065256 A1 | 4/2004 | Kim et al. | |
| 2004/0149211 A1 | 8/2004 | Ahn et al. | |
| 2005/0081788 A1 | 4/2005 | Jurgensen et al. | |
| 2005/0106864 A1 | 5/2005 | Jurgensen et al. | |
| 2005/0116064 A1* | 6/2005 | Basceri et al. | 239/419 |
| 2005/0199184 A1 | 9/2005 | Murugesh et al. | |
| 2006/0021703 A1 | 2/2006 | Umotoy et al. | |

FOREIGN PATENT DOCUMENTS

| | | |
|---|---|---|
| JP | 63 045374 A | 2/1988 |
| WO | 2005080631 | 9/2005 |

* cited by examiner

METHODS OF PROVIDING UNIFORM GAS DELIVERY TO A REACTOR

RELATED APPLICATIONS

This is a DIVISIONAL of application Ser. No. 11/278,700, filed 5 Apr. 2006, now abandoned, which is incorporated herein by reference.

FIELD OF THE INVENTION

The present invention relates to a gas distribution system for an atomic layer deposition or chemical vapor deposition processing system in which a vapor phase precursor is transported from an upstream source to a reaction space above a substrate.

BACKGROUND

The chemical deposition of thin solid films from gaseous (vapor-phase) chemical precursors onto solid substrates is of great interest in many areas including semiconductor fabrication, magnetic data storage, nanotechnology and others. In particular, atomic layer deposition (ALD) and chemical vapor deposition (CVD) processes are commonly used to deposit both dielectric and metal films onto semiconductor substrates. Increasingly, these applications require that the deposited film meet strict standards for thickness uniformity across the substrate and repeatability in such thicknesses over multiple substrates, while at the same time the process equipment is required to provide high film deposition rates so as not to present a bottleneck in the overall fabrication process.

In order for CVD and ALD equipment to meet such requirements, the flux of vapor precursors to the substrate must be tightly controlled and shaped. Often, there can be multiple gaseous precursors that must react to form the desired film and all must be delivered to the substrate in a precise and controllable manner. In some cases, it is advantageous to mix these multiple precursors together prior to introducing them into the reactor chamber. In other cases, it is preferable to maintain the precursors isolated from one another until they come into contact with the substrate so as to prevent any unwanted premature reactions.

Generally, uniform precursor flow into the reaction chamber is attempted by providing a flat plate with many small holes in between the gas-source and the substrate (a so-called showerhead). An early description of a device for providing such axial-symmetric gas flow towards a substrate is provided in U.S. Pat. No. 4,798,165 of deBoer et al. The diffusion plate or showerhead can have separate zones such that some holes are used for introducing one precursor and other holes are used for introducing the other precursor. In this way the precursors are kept separate so that no mixing occurs prior to the precursors entering the reaction space adjacent to the substrate.

One such showerhead is described in U.S. Published Patent Application 2006-0021703 of Salvador P. Umotoy. In this design, the showerhead faceplate has a number of gas passageways to provide a plurality of gases to the process region without commingling of those gases. A gas distribution manifold assembly is coupled so as to provide the different gasses to the various gas holes in the faceplate.

Another design for maintaining gases in separate passageways until they exit the distribution plate into the process region is described in U.S. Pat. No. 5,595,606. This showerhead includes a multiple block stack that ostensibly maintains two gases in separate passageways until they exit the distribution plate into the process region.

While showerheads of the sort described above purport to maintain separation of the various gases used in the ALD and CVD the present inventors have observed that if the relative flow rates of the different precursors flowing through adjacent holes are not well designed, recirculation can occur along the showerhead faceplate between the holes. FIG. 1 illustrates this condition. Shown in the diagram is a cut away view of a showerhead apparatus 10 having two individual gas manifolds generally indicated at 12 and 14. The upper manifold 12 includes gas passageways 16a and 16b, which provide means for the gas in manifold 12 to exit via holes 18a and 18b in the faceplate 20 of showerhead 10. Similarly, the lower manifold 14 includes gas passageways 22a and 22b, which provide means for the gas in manifold 14 to exit via holes 24a and 24b in faceplate 20.

As shown, recirculation of the different precursor gases has been known to occur along the showerhead faceplate 20 between the holes associated with the different manifolds 12 and 14. This undesired mixing of the precursors can cause unwanted reactions therebetween and reduce film uniformity on substrates in proximity thereto. Furthermore, when multiple zones are present within a single showerhead the spacing between the outlet holes of different zones becomes constrained by the number and size of holes required for flow uniformity.

Another problem with such showerhead designs is that it is difficult or impossible to maintain a difference in temperature between the two precursors because they both flow through the same solid plate 26 before reaching the faceplate 20. In many cases, it would be desirable to maintain precursors at different temperatures until they react at the substrate surface.

What is needed, therefore, is a gas distribution system that overcomes these limitations of conventional showerheads.

SUMMARY OF THE INVENTION

One embodiment of the present invention provides a gas distribution system for a reactor having at least two distinct gas source orifice arrays displaced from one another along an axis defined by a gas flow direction from the gas source orifice arrays towards a work-piece deposition surface such that at least a lower one of the gas source orifice arrays is located between an upper one of the gas source orifice arrays and the work-piece deposition surface. The precise distance from the upper gas source orifice array (or the lower gas source orifice array) to the work-piece deposition surface depends on a number of factors, including the shape of the individual orifices in each of the arrays and the gas flow rates for each array. In general, the orifice arrays are positioned within the reactor such that a relatively uniform deposition over the work-piece surface can be achieved using the necessary gases and flow rates for the particular layer to be deposited. In addition to the distance from the work-piece surface, the spacing between individual orifices of each array will affect the nature and quality of the deposited layer. Hence, orifices in the upper one of the gas source orifice arrays may spaced an average of 0.2-0.8 times a distance between the higher one of the gas source orifice arrays and the work-piece deposition surface, while orifices in the lower one of the gas source orifice arrays may be spaced an average of 0.1-2 times a distance between the higher one of the gas source orifice arrays and the work-piece deposition surface.

The higher one of the gas source orifice arrays may be a planar showerhead having a generally uniform distribution of orifices across its faceplate. The lower one of the gas source orifice arrays may include one or more conduits distributed axi-symetrically with respect to a radius of the planar showerhead. For example, the lower one of the gas source orifice arrays may include a number of spoke conduits leading from an axially centered feed conduit, and each spoke conduit including a number of individual orifices spaced an average of 0.1-2 times a distance between the higher one of the gas source orifice arrays and the work-piece deposition surface.

A further embodiment of the present invention provides for introducing gases into a reactor by flowing a purge gas from a first gas source orifice array disposed a first distance from a surface of a work-piece along an axis defined by gas flow from the first gas source orifice array to the surface of the work-piece while flowing a first reactive precursor into the reactor from a second gas source orifice array separate from the first gas source orifice array and disposed at a second distance from the surface of a work-piece along the axis defined by gas flow, said second distance being between said first distance. At an appropriate time, the flow of the first reactive precursor from the second gas source array may be stopped and the purge gas then flowed into the reactor from one or more of the first gas source orifice array and the second gas source orifice array. When unused portions of the first reactive precursor have been evacuated from the reactor, a second reactive precursor may be flowed into the reactor through the first gas source orifice array while flowing the purge gas into the reactor through the second gas source orifice array. Thereafter, the flow of the second reactive precursor from the first gas source array may be stopped, and unused portions of the second reactive precursor evacuated while flowing the purge gas into the reactor from one or more of the first gas source orifice array and the second gas source orifice array. This cycle may be repeated as needed to form a film on a substrate within the reactor.

Notwithstanding its applicability to ALD processes such as those described above, the invention is also useful in CVD and/or pulsed-CVD operations as discussed further below.

BRIEF DESCRIPTION OF THE DRAWINGS

The present invention is illustrated by way of example, and not limitation, in the figures of the accompanying drawings, in which.

DETAILED DESCRIPTION

Described herein are gas distribution systems for ALD, CVD and/or other processing systems in which vapor phase precursors or other gases (e.g., inert carrier gases) are transported from upstream sources to a reaction space above a substrate. Unlike such distribution systems of the past, the present distribution systems are composed of two or more physically separated gas source orifices. That is, embodiments of the present invention provide gas source orifices at different displacements from a surface of a substrate along an axis of the gas pathway from the orifices to that surface. Viewed differently, the gas source orifices (which may be supplied by a common manifold configured to provide gases or precursors separately to each orifice) are separated from one another along an axis defining a path for the gasses to travel between the orifices and the substrate.

Embodiments of the present invention provide both physical and thermal separation of reactive precursors until they come into close proximity to the substrate. This not only avoids undesired reactions along the faceplate of the showerhead, it also permits the individual precursors to be delivered at their individual optimum temperatures. Furthermore, systems configured in accordance with the present invention provide manufacturers greater flexibility in designing gas flow manifolds for each precursor, independent from the geometrical constraints of the other.

Figure 1:
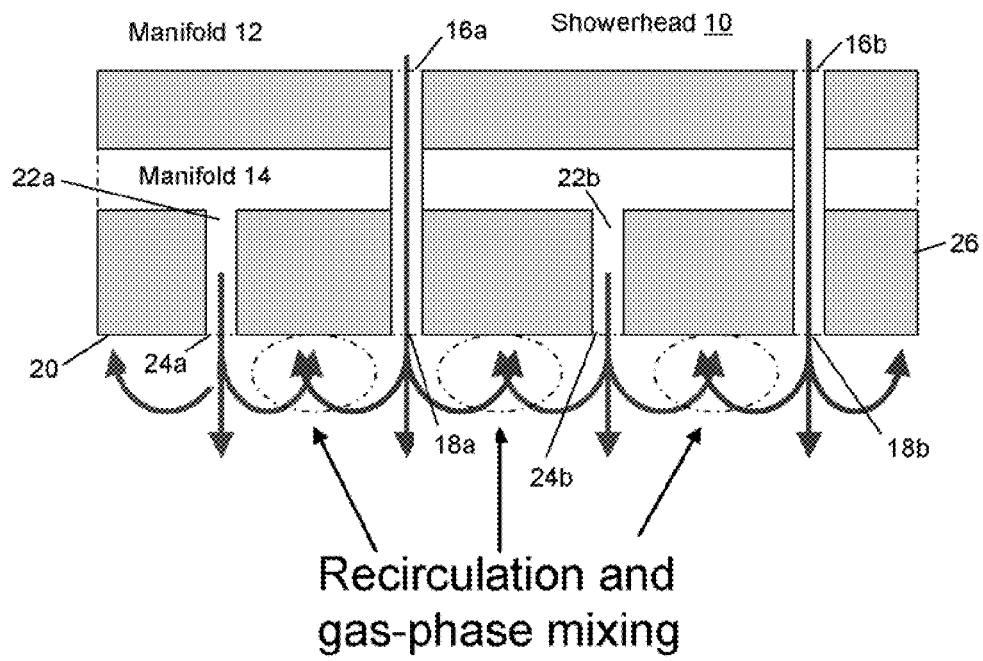
FIG. 1 shows an example of undesired gas recirculation and mixing which can occur when a conventional showerhead having gas passageways with exit holes in a single plane is used.
Figure 2:
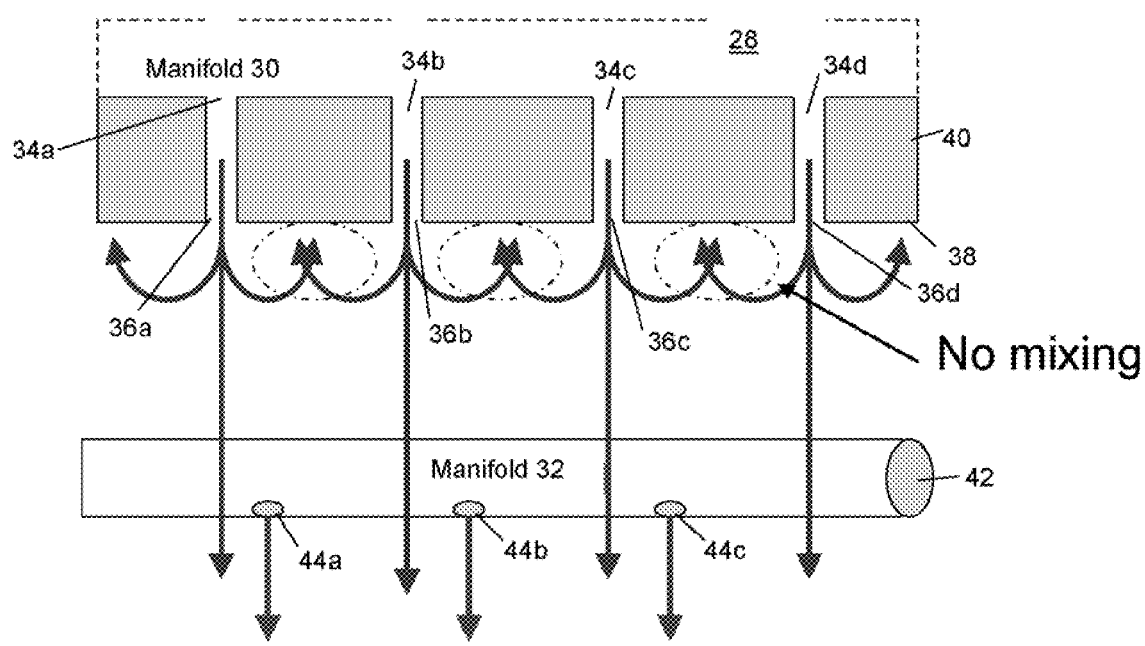
FIG. 2 shows an example of a showerhead configured in accordance with an embodiment of the present invention so as to prevent or reduce such undesired gas recirculation and mixing by displacing gas passageway exit holes into separate planes displaced from one another along an axis defined by the gas injection axis.

Turning now to FIG. 2, an example of a gas distribution system 28 configured in accordance with an embodiment of the present invention is illustrated. Note that although this illustration depicts a gas distribution system with two manifolds (or gas source orifice arrays as they are sometimes termed herein), the present invention is not limited to such systems. Any number of such manifolds can be used. In some cases, the gas distributions systems will have multiple gas orifices disposed in a single plane (such as is the case for the system illustrated in FIG. 1) and in addition will have other gas orifices disposed in a different plane (as described below). In other cases, three or more such orifice arrays separately disposed from one another along an axis of gas injection may be provided. Thus, the depiction of a system employing two such arrays displaced from one another is meant only to illustrate the concepts embodied in the present invention and should not be viewed as limiting the scope of the invention to such arrangements.

FIG. 2 then is a cut away view of a gas distribution system 28 having two individual gas manifolds generally indicated at 30 and 32. The upper manifold 30 includes gas passageways 34$a$-34$d$, which provide means for the gas in manifold 30 to exit via holes 36$a$-36$d$ in the faceplate 38 of a distribution plate 40. The lower manifold 32 includes a generally cylindrical gas passageway 40, which provide means for the gas in manifold 32 to exit via holes 44$a$-44$c$.

Of course, the individual manifolds are not limited to these illustrated configurations and, in general, any convenient configurations may be used to achieve desired gas distribution profiles within a reaction space proximate to a substrate. Thus, planar, curved, corrugated, cylindrical or other manifolds/distribution devices may be employed. For example, the faceplate 38 of upper manifold 30 need not be a flat (or relatively flat) surface as is shown in the illustration. Instead, faceplate 38 may have a corrugated or even saw tooth profile. Further, regardless of whether the faceplate 38 is flat or not, it need not necessarily be planar. Instead, various embodiments of the present invention may find particular application for a curved (e.g., relatively concave or relatively convex) faceplate 38.

The lower manifold 32 may itself be something other than a cylindrical gas passageway. For example, the lower manifold may be a relatively planar diffuser plate. Alternatively, the lower manifold 32 may be a series of radially projecting cylinders resembling the spokes of a bicycle wheel (as is shown in later figures and described further below). In some cases the individual spoke-like orifice arrays may be of different lengths and/or diameters and arranged so as to provide a desired gas flow to a substrate. The spoke-like arrays may be independent of one another or may be coupled to one another via azimuthally-oriented or chord-like members and/or gas source orifice arrays.

In some cases the distance between the lower manifold 32 and the upper manifold 30 may be adjustable. For example, the lower manifold 32 may be suspended beneath the upper manifold 30 by one or more telescoping (e.g., pneumatic or hydraulic) supports which operate under the control of a controller so as to set the lower manifold at a desired distance from the faceplate 38 of the upper manifold 30. Alternatively, the supports or other means of adjusting the separation distance between the manifolds may be manually configurable. Different CVD and/or ALD processes may require such different spacings between the manifolds in order to achieve desired deposition characteristics on substrates.

Whether adjustable or not, the optimal distance between the upper and lower manifolds may be dependent on the characteristics of the individual orifices present therein. Hence, to accommodate a wide variety of applications, the present invention encompasses the use of different types of orifices in either or both of the manifolds. Some orifices may be substantially cylindrical in cross-section, while others may be more funnel-like in cross-section so as to provide a wider dispersal of the gas exiting the orifice than might otherwise be achieved using orifices having a cylindrical cross-section. So too may the number of holes in each individual manifold be adjusted to provide a desired gas distribution profile at the surface of the work-piece undergoing processing. Different arrangements of orifice types and numbers in different radial areas of either or both of the manifolds may provide for relatively uniform deposition rates across an entire surface of a substrate. Individual orifices may be circular, rectangular, square, triangular, etc., in transverse section.

While these various arrangements of orifices of different types are not critical to the present invention, the overall goal of providing a gas delivery system configured to achieve substantially uniform deposition across an entire substrate surface while avoiding undesired cross-mixing of precursor gases should not be overlooked. In the case of a lower manifold having radial, spoke-like orifice arrays for gas distribution, reduced spacing between individual orifices would imply having more spokes in the entire array. This may not necessarily be desirable in that a wider spacing with fewer individual orifices would provide fewer opportunities for undesired mixing of precursor gasses along the arms of the lower gas distribution array and, hence, reduced overall formation of contaminant particles.

As shown in FIG. 2, manifold 32 is displaced from manifold 30 along an axis (Z) in the direction of gas injection from the respective holes of each manifold. Hence, the recirculation of the different precursor gases from the different manifolds does not lead to any undesired mixing of the precursors along the faceplate 38 of distribution plate 40. This improves the film deposition characteristics of systems employing system 28 over those which make use of conventional showerheads.

Figure 3:
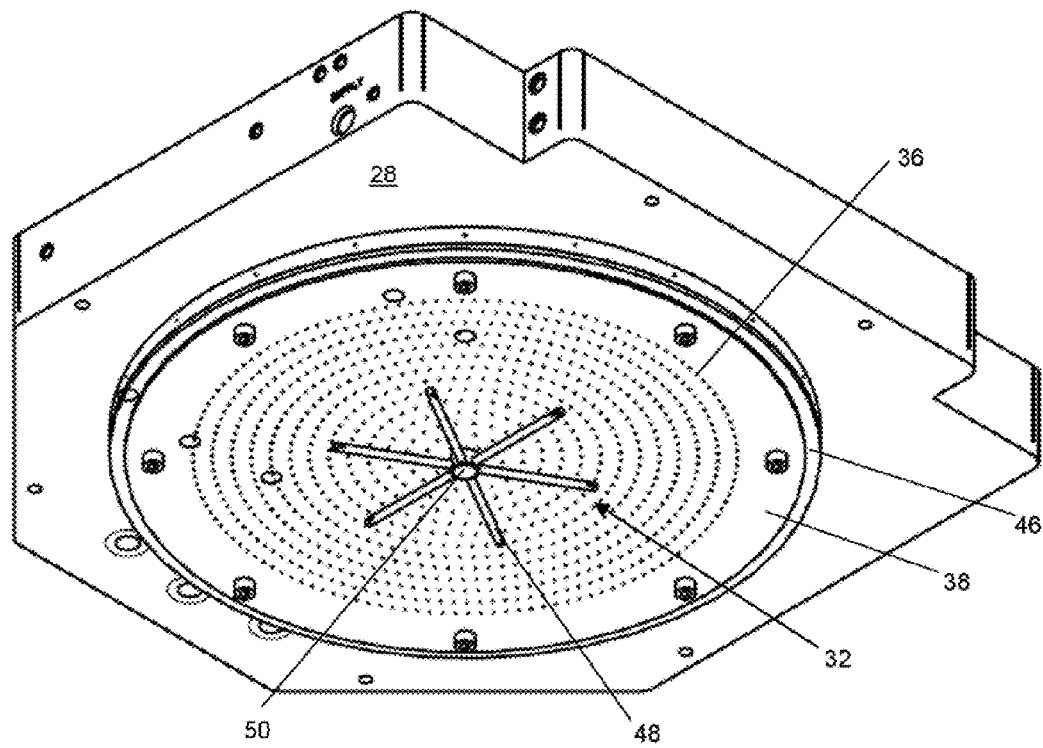
FIG. 3 shows an example of a showerhead configured in accordance with an embodiment of the present invention in which a radial spoke gas injection conduit is displaced beneath a planar gas distribution plate.

FIG. 3 shows an isometric view of the gas distribution system 28. The upper manifold is composed of a relatively flat distribution plate 40 with multiple through-holes 36 in faceplate 38 to allow precursor vapors and purge gases to enter the reactor (not shown). The lower manifold 32 is configured as an array of radial tubes 48 joined to a central inlet 50. The tubes 48 have a series of outlet holes (not shown in detail in this drawing) to provide for uniform delivery of precursor and purge gases. The tubes 48 may be organized as one or more conduits distributed axi-symmetrically with respect to a radius of the planar distribution plate 40.

Figure 4:
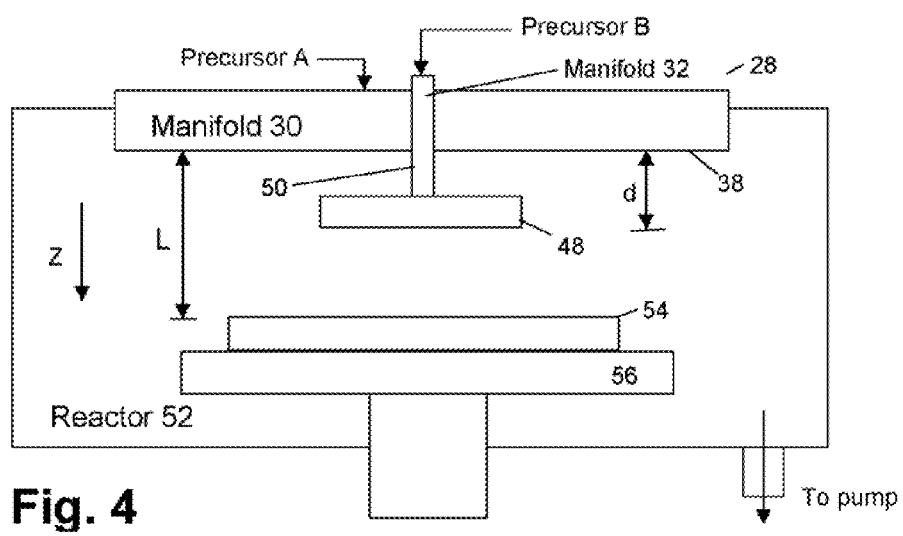
FIG. 4 shows an example of an ALD reactor having with a gas distribution system configured in accordance with an embodiment of the present invention.

FIG. 4 illustrates an example of an ALD reactor 52 having a gas distribution system configured in accordance with an embodiment of the present invention. In this cut away view, a wafer 54 is placed on a susceptor 56 (which may be vertically movable along the Z axis and may also include a heater) beneath the gas distribution system 28. The gas distribution system 28 may be part of a lid assembly for reactor 52 or may be separate therefrom. As indicated above, the gas distribution system includes an upper manifold 30, which is configured to receive precursor A from an upstream source, and a lower manifold 32, which is configured to receive precursor B from a separate upstream source. Each of the manifold may also be configured to receive purge gasses. Manifold 30 distributes precursor A towards substrate 54 through holes (not shown in this view) in the faceplate 38, while manifold 32 distributes precursor B towards substrate 54 through holes (also not shown in this view) in radial arms 48. The radial arms are fed via central inlet 50. Manifold 32 is displaced below the faceplate 38 of manifold 30 along the axis of gas injection towards the substrate 54 (the Z axis) by a distance "d".

Figure 5:
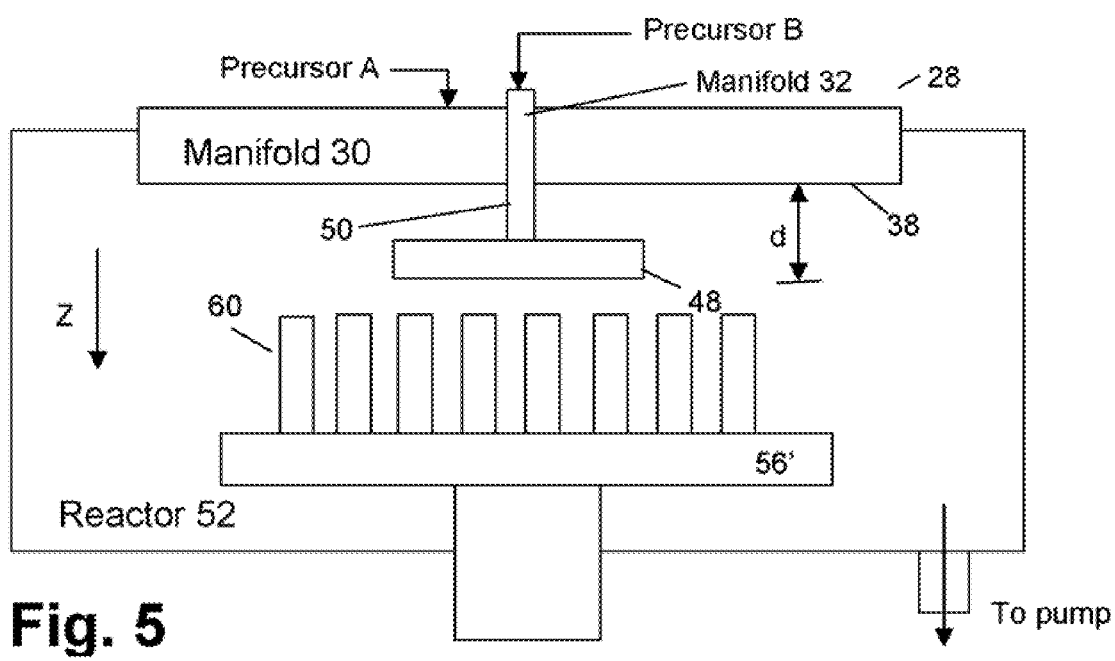
FIG. 5 illustrates a variation of the ALD system shown in FIG. 4 in which multiple wafers are processed in a single rector.

FIG. 5 illustrates a variation of the above-described system in which multiple wafers or other substrates 60 are accommodated in a single reactor 52. The wafers 60 may be supported on a linear array 56'. Alternatively, the wafers may be placed in a radial array that resembles a carousel. Accordingly, the wafers 60 could be aligned along radial directions with respect to the center of a circular supporting element. A multi-wafer reactor of this type may be used where backside depositions can be tolerated (or otherwise compensated for) and may improve overall throughput. Similarly, reactors such as reactor 52 may be configured for use in stand-alone tools or in multi-single wafer tools or in cluster tools.

Importantly, the lower manifold 48 need not have a radial spoke configuration as depicted in the illustration. In some cases the lower manifold may be a point source (i.e., a gas orifice having a substantially circular or other cross-section). Alternatively, the lower manifold 48 could be a planar (or relatively planar) source, a source having a concave cross-section, or a radial spoke configuration with spokes of varying lengths. Further, the lower manifold 48 may be relatively smaller or larger than as depicted in the illustration. That is, the lower manifold 48 may have a diameter equal to or greater than the substrate 54 or, the lower manifold may have a diameter smaller than that of the substrate, as shown.

Moreover, precursor B need not necessarily be fed to the lower manifold 32 via a single, central supply line. Instead, some configurations may have precursor B being fed to the orifice array through a lateral line or other, non central axial-symmetric feed line or lines. The details of such gas feed lines from an external gas supply source are not critical to the present invention.

In one embodiment of the present invention, the faceplate 38 of manifold 30 is located a distance "L" from the surface of substrate 54 on which deposition is to occur. In practice, "L" will be an average distance of an intended plane defined by the faceplate 38 from the surface of the substrate 54 and individual distances of any point on the faceplate 38 will reside at a distance $L \pm \delta 1$ from said surface, owing to nonuniformities in the faceplate surface and the surface of the substrate 54. Preferably, the holes in faceplate 38 through which precursor A gases will be introduced to reactor 52 will spaced an average of 0.2-0.8 times L±δ1 from one another. In further embodiments, the holes in manifold 32 may be spaced an average of 0.1-2 times L±δ1 from one another. Note that this latter spacing may be achieved through selected positioning of the various radial arms 48 of manifold 32.

Further, the distance from the lower manifold 32 to the surface of the substrate 54 will be some fraction of L. In various embodiments of the invention this distance may be 0.3-0.9*L, and in one embodiment that was reduced to practice was 0.7 L. Typically, L will be approximately one inch.

During a typical ALD process in which the present gas distribution assembly would be used, manifold 30 will be flowing purge gas while manifold 32 is flowing reactive precursor B. In the next step of the process both manifolds 30 and 32 will flow purge gas to assist in removing any unreacted precursor from the reactor 52. Unused precursors and purge gases are exhausted from reactor 52 via a pumping arrangement (not shown). Next, precursor A will be introduced through manifold 30 and purge gas will flow through manifold 32. Finally, both manifolds 30 and 32 will flow purge gas to assist in removing any unreacted precursor. The flows of precursor and purge gas may be alternated in this fashion throughout the deposition process to allow the substrate 54 to be sequentially exposed to each of the precursors without allowing the precursors to mix in the gas phase.

The above-described process allows for uniform delivery of precursor vapor by introducing one of the reactant species through a flat plate with a plurality of through-holes while the second reactant species is introduced through a set of conduits radiating outward from a centrally located inlet. The conduits are situated such that they are between the flat plate and the substrate. This provides delivery of both reactants while maintaining thermal and physical isolation between the chemicals.

In some ALD processes, one of the ALD half-reactions will be soft saturating while the other is not. In such cases it may be desirable to introduce the precursor associated with the soft saturating half reaction through the upper manifold. For example, the precursor associated with the soft saturating reaction may require more uniform distribution, as may be achieved through introduction via the upper, relatively planar gas orifice array. In contrast, the precursor associated with the strongly saturating half-reaction in the ALD process may be relatively insensitive to distribution via a nonuniform gas orifice array such as the lower manifold. This may not always be the case, however, inasmuch as relative gas flow rates must also be taken into consideration.

In addition to ALD processes, the present invention may be used in connection with CVD and/or pulsed-CVD processes. In a typical CVD process both manifold 30 and manifold 32 may be flowing purge gases and/or reactive precursors (potentially with respective carrier gasses). When a desired deposition has been achieved, the flow of reactive precursors will be stopped and either or both manifolds 30 and 32 may flow purge gas to assist in removing any remaining precursors from the reactor 52.

In a pulsed-CVD process a first precursor and carrier gas may be introduced continually through manifold 30 and the second precursor introduced in a pulsed fashion through the lower manifold 32. Preferably, the precursor introduced via the lower manifold will be the one which has a dominant surface reaction during the CVD. As before, once the desired deposition has been achieved, the unused precursors and purge gases are exhausted from reactor 52 while flowing purge gas through one or both of the manifolds.

In further embodiments, the two manifolds may be operated so as to variously flow reactive precursors, precursors and carrier gases, and/or purge gas at various times in an ALD, CVD or other process so as to achieve a desired deposition on a substrate within the reactor. For example, while a precursor is introduced via the upper manifold (with or without a carrier gas), the lower manifold may be used to introduce a second precursor (with or without its own carrier gas) or purge gas and vice-versa.

Thus, a gas distribution system composed of distinct, physically separated source orifices to supply precursor vapors and inert gases to a substrate has been described. The distinct gas sources are oriented such that one orifice is located between the substrate and the other orifice. This prevents gas recirculation that is often observed with conventional showerheads, when the precursor vapors and inert gases are injected through adjacent orifices, and prevents premature reactions that are often observed when the precursors and purge gases are introduced through a single orifice. Stated differently, in contrast to conventional showerheads gas distribution systems configured in accordance with the present invention do not provide a gas recirculation zone between the outlet orifices of the separate gas manifolds. This improves purging and can minimize gas-phase mixing and turbulence, both of which can lead to unwanted film deposition or particle formation It should be apparent from the preceding discussion that the use of separate gas source orifices that are not constrained to a single flat-plate allows much more freedom in designing the size and shape of each precursor manifold. When both precursor manifolds are constrained to have their outlet orifices in the same horizontal plane as in a conventional showerhead, the designer may not be able to achieve optimal flow uniformity for both precursors. At a minimum, the designer may have to resort to complex manifold and gas flow passages to achieve uniform flow. However, when separating the precursor manifolds into distinct orifices that are not in the same plane, in accordance with the present invention, it is much easier to obtain gas flow uniformity with simple gas flow passages. Of course, although the present invention was discussed with reference to certain illustrated embodiments, these examples should not be used to limit the broader scope of the invention as set forth in the following claims.

What is claimed is:

1. A method for introducing gases into a reactor, comprising during a first time interval flowing a purge gas into the reactor from a first gas source orifice array disposed a first distance from a surface of a work-piece along an axis defined by gas flow from the first gas source orifice array to the surface of the work-piece while flowing a first reactive precursor into the reactor from a second gas source orifice array separate from and not fluidly coupled to the first gas source orifice array and disposed at a second distance from the surface of a work-piece along the axis defined by gas flow, said second distance being less than said first distance;

during a second time interval, flowing the purge gas into the reactor from both the first and second gas source orifice arrays while evacuating the reactor;

during a third time interval, flowing a second reactive precursor into the reactor through the first gas source orifice array while flowing the purge gas into the reactor through the second gas source orifice array; and during a fourth time interval, flowing the purge gas into the reactor from both the first and second gas source orifice arrays while evacuating the reactor.

2. The method of claim 1, wherein the second reactive precursor is associated with a soft saturating atomic layer deposition half reaction and the first reactive precursor is associated with a strongly saturating atomic layer deposition half reaction.

3. The method of claim 1, wherein the first gas source orifice array is a relatively planar gas orifice array.

4. The method of claim 1, wherein the first reactive precursor is accompanied by a carrier gas when introduced into the reactor via the second gas source orifice array.

5. The method of claim 1, wherein the second reactive precursor is accompanied by a carrier gas when introduced into the reactor via the first gas source orifice array.

6. The method of claim 1, wherein both the first reactive precursor and the second reactive precursor are accompanied by a carrier gas when introduced into the reactor via the second gas source orifice array and the first gas source orifice array, respectively.

7. A method for introducing gases into a reactor, comprising during a first time interval flowing a first reactive precursor into the reactor from a first gas source orifice array disposed a first distance from a surface of a work-piece along an axis defined by gas flow from the first gas source orifice array to the surface of the work-piece while flowing a second reactive precursor into the reactor from a second gas source orifice array separate from and not fluidly coupled to the first gas source orifice array and disposed at a second distance from the surface of a work-piece along the axis defined by gas flow, said second distance being less than said first distance; and during a second time interval flowing a purge gas into the reactor from both the first gas source orifice array and the second gas source orifice array.

8. The method of claim 7, wherein the second reactive precursor is flowed into the reactor in a pulsed fashion via the second gas source orifice array.

9. The method of claim 7, wherein the first gas source orifice array is a relatively planar gas orifice array.

10. The method of claim 7, wherein the first reactive precursor is accompanied by a carrier gas when introduced into the reactor via the first gas source orifice array.

11. The method of claim 7, wherein the second reactive precursor is accompanied by a carrier gas when introduced into the reactor via the second gas source orifice array.

12. The method of claim 7, wherein both the first reactive precursor and the second reactive precursor are accompanied by a carrier gas when introduced into the reactor via the first gas source orifice array and the second gas source orifice array, respectively.

13. A chemical vapor deposition (CVD) process, comprising:
   flowing reactive precursors through each of two manifolds of a gas distribution system into a reactor of a chemical vapor deposition apparatus, the manifolds being distinct and separate from one another, not fluidly coupled to one another, and one of the manifolds being disposed higher than the other along a gas flow direction axis with respect to a surface of a substrate within the reactor;
   upon achieving a desired deposition on a surface of the substrate, stopping the flow of reactive precursors; and
   subsequently, flowing a purge gas through either or both of the manifolds to assist in removing any remaining precursors from the reactor;
   wherein a first one of the reactive precursors is introduced continually through an upper one of the manifolds and a second one of the precursors is introduced in a pulsed fashion through a lower one of the manifolds.

14. The process of claim 13, wherein the second one of the precursors introduced via the lower one of the manifolds is a precursor, having a dominant surface reaction as compared to the first one of the precursors during the CVD process.

15. The process of claim 14, wherein at least one of the first and second precursors is introduced into the chamber along with a carrier gas.

* * * * *